United States Patent [19]

Mikalesen et al.

[11] Patent Number: 4,824,544
[45] Date of Patent: Apr. 25, 1989

[54] LARGE AREA CATHODE LIFT-OFF SPUTTER DEPOSITION DEVICE

[75] Inventors: Donald J. Mikalesen, Carmel; Stephen M. Rossnagel, White Plains, both of N.Y.

[73] Assignee: International Business Machines Corporation, Armonk, N.Y.

[21] Appl. No.: 114,896

[22] Filed: Oct. 29, 1987

[51] Int. Cl.[4] .............................................. C23C 14/34
[52] U.S. Cl. .............................. 204/298; 204/192.12; 204/192.32
[58] Field of Search ............... 204/192.1, 192.12, 298, 204/192.32, 298 TT, 298 PS, 298 CS, 298 MS File, 298 ME, 298 E, 298 EP, 298 EE; 156/345

[56] References Cited

U.S. PATENT DOCUMENTS

| | | | |
|---|---|---|---|
| 3,410,774 | 11/1968 | Barson et al. | 204/298 |
| 3,654,110 | 4/1972 | Kraus | 204/192 |
| 3,897,325 | 7/1975 | Aoshima et al. | 204/298 |
| 3,932,232 | 1/1976 | Labuda et al. | 204/298 X |
| 4,521,286 | 6/1985 | Horwitz | 204/298 X |
| 4,588,490 | 5/1986 | Cuomo et al. | 204/298 |
| 4,661,203 | 4/1987 | Smith et al. | 204/298 X |
| 4,724,060 | 2/1988 | Sakata et al. | 204/192.12 X |

OTHER PUBLICATIONS

IBM Technical Publication RC10976, Feb. 1985, Cuomo et al, entitled "Enhancement Plasma Processes".
J. Vac. Sci. Technol. A4(3), May/Jun. 1986, "Hollow-Cathode-Enhanced magnetron Sputtering," by Cuomo et al, pp. 393–396.
J. Vac. Sci. Technol. A4(1), Jan./Feb. 1986, "Erosion Profile of a Radio Frequency Planar Magnetron Sputtering Target with Aperture Shield," by Holdeman et al, pp. 137–138.
IBM Technical Publication RC11759, Mar. 1986, entitled "Lift-Off Deposition Techniques Using Sputtering" of Cuomo et al.

Primary Examiner—Nam X. Nguyen
Attorney, Agent, or Firm—Roy R. Schlemmer, Jr.

[57] ABSTRACT

An etching/deposition system comprising a hollow cathode electron source in combination with a magnetron sputter deposition plasma device within a containment chamber, said hollow cathode being disposed to inject electrons into the magnetic field of the magnetron plasma device adjacent to the magnetron cathode surface to which a deposition source is affixed. Said system further includes means for initiating and maintaining a discharge plasma within the hollow cathode and for initiating and maintaining the magnetron plasma. The improvement of the invention comprises a workpiece to be coated, located in said chamber, spaced from said magnetron cathode surface which may be biased to attract particles emitted by said deposition source. A particle collimation filter is interposed between the magnetron cathode surface and said target sample but outside of said plasma region, which prevents any deposition particles from reaching said target sample which are not travelling in a direction substantially perpendicular thereto.

6 Claims, 1 Drawing Sheet

LARGE AREA CATHODE LIFT-OFF SPUTTER DEPOSITION DEVICE

FIELD OF THE INVENTION

The present invention relates generally to the field of high plasma density magnetron sputter etching/deposition systems utilizing hollow cathode enhancement of the sputtering process. It relates still more particularly to apparatus used in the process which improves the efficiency and speed of the system while extending its applicability.

BACKGROUND OF THE INVENTION

Lift-off deposition techniques are in general usage in the semi-conductor industry. Lift-off has, until very recently, only been possible with evaporation based deposition processes.

Lift-off refers to the process step in the production of semi-conductor devices which consist of removing a photo resist mask together with any surface material which has been deposited thereon, usually by some form of solvent method. During the fabrication process, as is well understood, the deposited material covers not only the area on a substrate where the material is desired but also actually covers the mask which must be removed together with the unwanted material before the next step in the deposition or manufacturing process can take place. Since the mask is covered with the deposition material such as various semi-conductor metal layers, insulators, etc., the solvent can only reach the mask at the edges of the mask structure where, theoretically, the mask is not coated with the deposition material. In order for this process to work it is necessary that the edges of the mask either be vertical or slightly overhang the unmasked areas to assure that an uncoated edge of the mask is available to and subject to the action of the solvent. It is accordingly very desirable, and in fact necessary, to only utilize those processes in the deposition procedures which will only coat the planar surfaces and not the edges of the masks.

Accordingly, lift-off has until very recently only been possible with evaporation-based deposition processes as mentioned previously. The evaporation deposition process approximates a point source operating in an environment of low pressure ($<10^{-3}$ Torr) resulting in a "line of sight" deposition. This is because the deposited films tend to coat only the planar surfaces of the substrate mask assembly leaving the edges uncoated. Stated very simply, this is a characteristic of the evaporation process.

It is well known that various types of sputtering processes produce much more rapid deposition rates which wold theoretically greatly reduce process times and thus production costs. However, attempts to use sputtering in the past have resulted in very poor lift-off.

With known sputtering processes such as magnetron sputtering, extremely dense clouds or fogs of the material to be deposited were formed in the reaction area due to the extremely high pressures necessary to achieve the sputtering reaction. The existence of this fog caused sides as well as planar surfaces to be plated thus resulting in the lift-off difficulties alluded to above. Recent developments have allowed the extension of lift-off techniques into the sputtering area by the development of hollow cathode enhanced processes are references [1,2,3] are set forth subsequently.

The hollow cathode enhanced magnetron sputtering system utilizes a small hollow cathode electron source which injects energetic electrons into magnetron plasma. The resultant plasma can be operated at significantly lowered pressure than conventional magnetron devices. If a small magnetron source is used, lift-off quality depositions have been attained with a target-to-workpiece distance of eight or more inches. The inherent limitation with such techniques, however, is the requirement that the magnetron source be quite small. For example, good quality lift-off depositions have been demonstrated with a magnetron three inches in diameter with a workpiece distance of nine inches. The limitation on deposition rate with the system, however, is about five to eight Angstroms per second due to the high-power density at the cathode. This limitation limits implementation of this technology on a manufacturing scale.

An additional problem, even with the above described hollow cathode enhanced magnetron, is due to the random trajectory of the deposited material as it leaves the magnetron surface and travels to the workpiece to be deposited which causes the impingement angles of the various particles as they strike a workpiece to be totally random. In other words, many of the particles strike the sample surface at acute angles. This allows them to form deposits on the sides or even underneath overhanging portions of the masks thus leading to the difficulties in lift-off mentioned above.

There is accordingly a distinct need for improvement in even the hollow cathode enhanced magnetron sputtering process in order to render it suitable for full-scale manufacturing operations.

LIST OF REFERENCES

[1] U.S. Pat. No. 4,588,490 dated May 13, 1986 of Cuomo et al, entitled "Hollow Cathode Enhanced Magnetron Sputtering Device".

[2] An article entitled "Enhancement Plasma Processes", IBM Technical Publication RC10976 February, 1985 of J. Cuomo et al, available from the library of the IBM T.J. Watson Research Center in Yorktown Heights, N.Y. 10598.

[3] An article entitled "Hollow Cathode Enhanced Magnetron", Journal Vacuum Science Techniques (1986) of J. Cuomo et al, Vol. A-4, pp. 393–396.

[4] An article by L. B. Holderman and N. Morell entitled "Erosion Profile of an R. F. Planar Magnetron Sputtering Target with Aperture Shield", in The Journal of Vacuum Science and Technology, Vol. A-4 page 137 (1986).

DESCRIPTION OF THE PRIOR ART

The following references are in addition to those cited in the Background of the Invention section and were found as a result of an extensive prior art search conducted in the United States Patent and Trademark Office. As will be apparent, the references are only of a general background nature as no suggestion was found anywhere in the art of a particle collimating filter used in conjunction with a hollow cathode enhanced sputtering device.

U.S. Pat. No. 3,654,110 issued Apr. 4, 1972 of F Class is cited as background art. It merely discloses a cathode structure used in a sputtering apparatus which has a number of rectangular openings therein. It is noted, however, that this cathode in no way acts to produce a collimated particle beam as the openings are far too short and too large in cross section.

IBM research report No. RC-11759 dated March, 1986 entitled "Lift-off Deposition Techniques Using Sputtering" Of J. Cuomo et al, available from the library at the T.J. Watson Research Center in Yorktown Heights, N.Y., 10598 generally describes a method of depositing lift-off quality thin films utilizing ion beam sputter deposition and a hollow cathode enhanced magnetron sputter deposition system. There is no suggestion of a collimating filter in this article.

SUMMARY AND OBJECTS OF THE INVENTION

It is accordingly a primary object of the present invention to provide an improved hollow cathode enhanced magnetron sputtering device which allows large areas magnetrons to be utilized.

It is another object of the invention to provide such an enhanced magnetron sputtering apparatus providing significantly improved lift-off characteristics.

The objects of the present invention are accomplished in general by a hollow cathode enhanced magnetron sputtering apparatus comprising a hollow cathode electron source in combination with a magnetron diode device wherein said hollow cathode device is disposed to inject electrons into the magnetron diode plasma whereby the electrons intersect magnetic field lines which traverse the front of the magnetron cathode surface. The workpiece to be coated is located at a distance from said magnetron cathode surface. A particle collimating apparatus is located within the chamber disposed between the magnetron and the workpiece to be coated and is characterized in that it consists of a series of closely packed elongated tubular members, the axis of said members being substantially at right angles to the surface to be coated and the magnetron cathode surface. The length to diameter ratio of the tubular members is such that particles having an angle greater than ten degrees from the normal to the surface of said workpiece cannot pass there through.

The function of the particle collimating device is to insure that all coating particles passing through the device produces result in a collimated stream of particles striking the surface to be coated so that very few if any particles are able to reach and thus be deposited upon the sides of the mask.

Use of the improved system of the present invention gives greatly improved lift-off results as there is virtually no material to interfere with the removal of the mask when used with the hollow cathode enhanced magnetron sputtering device with its inherent greatly improved deposition rates, low pressures etc.. Additionally, the disclosed structure allows much larger area magnetrons to be utilized.

Other object features and advantages of the present invention will be apparent from the following description of the invention as set forth in the specification drawings and claims.

DESCRIPTION OF THE PREFERRED EMBODIMENT

Figure 1:
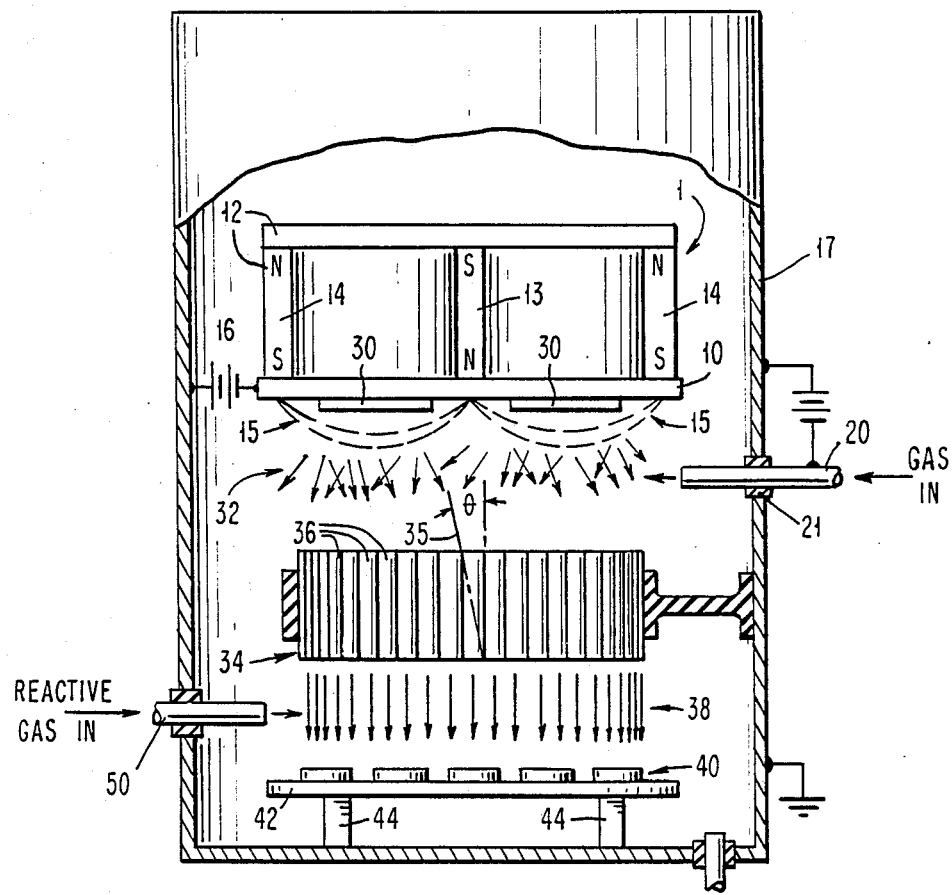
FIG. 1 comprises a cross-sectional diagrammatic view of a hollow cathode enhanced magnetron sputtering device incorporating the particle collimating filter of the present invention.

The present invention is based on the use of a hollow cathode enhanced magnetron sputtering system described previously. A cross-sectional view of the improved sputtering system of the present invention is shown in FIG. 1. The apparatus consists of a conventional magnetron 1. The magnetron target 10 is placed on a magnet assembly 12 which consists of a central pole 13 of one magnetic polarity, and a circular outer pole 14 of the opposite polarity. Magnetic field lines 15 are shown connecting the two poles. The strength of the magnetic field is related to the density of these virtual field lines 15. The magnetron target 10 is biased by up to several hundred volts negative by magnetron power supply 16. For RF operation the DC power supply 16 would be replaced with an RF power supply and a suitable matching network as is well known in the art. An RF power supply would be used if the deposition source were an insulator such as quartz. The disclosed embodiment of the chamber 17 functions as the anode, although a separate anode closer to the target 10 could be used. The chamber 17 also functions as a vacuum vessel.

A critical aspect of the present hollow cathode enhanced magnetron is the coupling between the hollow cathode plasma and the magnetron plasma. The coupling of the two devices depends critically on the relative positioning of the hollow cathode or multiple hollow cathodes with respect to the magnetron cathode. One example of a suitable position for the hollow cathode is shown in FIG. 1 for the disclosed planar magnetron. In this case, the hollow cathode 20 and insulator 21 are mounted below the magnetron target 10, close to the outer edge, and projecting horizontally in towards the magnetron's center. The radial position of the hollow cathode 20 must be such that the intersected magnetic field lines traverse the cathode face and intersect the center pole 13. The vertical positioning of the cathode at this radial position as shown in the figure will determine the strength of the magnetic field at the cathode and the coupling efficiency of the cathode to the magnetron plasma. The coupling efficiency and the criteria which determine this positioning have been discussed in a number of the previously cited references and need not be discussed further, as this is not a critical aspect of the present invention.

The ions from the combined plasma of the magnetron and the hollow cathode bombard the cathode surface 10 which has a deposition source material 30 attached to the surface thereof. The ion bombardment causes sputtering of this material which in turn forms a random flux 32 of the material 30 leaving the cathode at all angles as indicated by the arrows in the drawing. It is of course noted that the predominant direction is away from the cathode. By using the hollow cathode, the pressure of this device can be made low enough that the sputtered atoms from the material 30 have very long path lengths relative to the scale of the device. This means that the sputtered atoms will travel in straight lines, without significant collisions with other atoms until they strike a surface.

Figure 2:
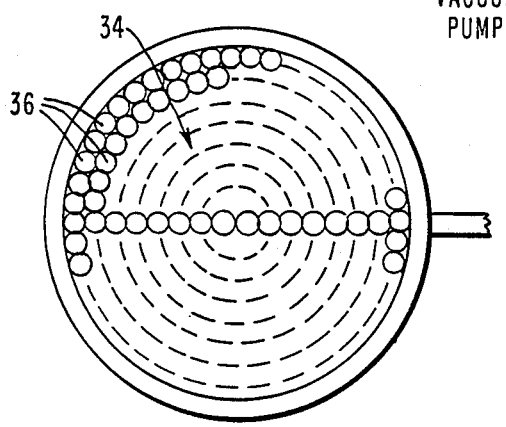
FIG. 2 comprises a top view of a preferred embodiment of the particle collimating filter of the present invention.

The essence of the present invention comprises the particle collimation filter 34 which comprises an array of closely packed collimizing tubes 36. These tubes 36 are arranged in a close packed structure as indicated in the top view of FIG. 2, and have a suitable length to diameter ratio such that the angle from a point on one end of the tube to another point on the opposite side of the opening end of the tube does not exceed a few degrees. Typically, for lift-off depositions this angle should be no greater than ten degrees.

This angle is illustrated by the dotted line 35 and the angle Θ shown in the figure. The line 35 thus represents, the maximum angle that a particle could have without striking the filter element 34.

The tubes may be of any cross-section, but should be as closely packed as possible. Thus, the structure could be made as a series of intersecting plates to form square or rectangular openings through the structure.

The function of the tube array 34 is to produce a collimated flux of the sputtered material, shown in the figure by the reference numeral 38. This material then impinges or lands upon the samples 40 which are placed on the substrate platform 42. Although the platform, is shown as fixed on the supports 44 it is probable that there would need to be some movement capabilities for the platform in order to obtain completely uniform films and or deposit on a large number of workpieces.

The lift-off deposition requires that the depositing flux 38 arrive at the sample surface at very close to the vertical. If not, the sidewalls of the lift-off structure (mask) will be coated, hindering removal of the mask as described previously. The present invention satisfies this requirement because the flux is collimated by the particle collimation filter 34 and because the pressure within the reaction chamber is very low, due to the enhancement of the plasma by the hollow cathode. A conventional magnetron without hollow cathode enhancement would have much too high a level of gas scattering due to the high pressure to allow the technique to be used successfully.

The present invention solves the problem of scaling of lift-off sputter depositions to large sizes. Prior art hollow cathode enhanced magnetrons relied on the small size of the magnetron to provide a perpendicular flux at a large distance with low scattering due to the low pressure. The small size and large distance reduced the net deposition rate capability of such devices. The present invention does not suffer from these limitations. There is no reason why the cathode in FIG. 1 cannot be of any reasonable size. Systems several feet long are available commercially. The only requirements are the acceptance angle of the tube array 34 described previously and that the chamber pressure be sufficiently low to eliminate significant scattering on the scale of the distance from the cathode 10 to the sample 40. It has been found that pressures in the 0.2–0.7 milli Torr range will allow workpiece distances of between 5 and 8 inches to be used for example.

The geometry described in the disclosed embodiment has other attractive advantages over prior art devices. For example, the tube array 34 can also function as a ground shield for the magnetron cathode 10. Thus, any energetic electrons will be collected by the array 34 and will not deposit on the samples. This can be of critical importance for the depositions onto delicate polymer structures, which cannot stand the power flux of the energetic electrons. Similarly, the delicate silicon device structures are also similarly shielded since they likewise can be damaged by energetic particle bombardment.

In addition to a ground shield, the array 34 can also function as the anode for the magnetron or for the hollow cathode source. In this latter case, the hollow cathode can then be electrically grounded, and requires no power supply at all to operate, but of course the anode must be powered.

A further use for array 34 is cooling. If the array is water cooled in some way, a significant portion of the radiant heating from the cathode surface can effectively be shielded from potentially delicate sample structures. This could be done by the simple expedient of using a cooling coil around the outside of the array 34.

A still further use of the array is in the area of reactive deposition. In this case, the array functions as a conductance block for reactive species introduced at the sample surface from contaminating the target surface. This reduces the poisoning of the cathode which usually results in low sputtering rates. Such a reactive gas source 50 is shown in FIG. 1 entering the chamber 17 near the workpiece.

A still further feature made available by the present geometry is the potential enhancement of the erosion rate on the cathode surface due to the presence of the collimating structure. A recent paper [4] has described the increase in erosion rate of the magnetron target due to the presence of small shields over the edge of the cathode. The effect of these shields was to apparently increase the plasma density locally, due to the effect of a hollow cathode type of trapping. The present invention can utilize this effect to a broad degree over the entire surface of the cathode, and hence result in a denser plasma, a higher etch rate of the cathode and a higher deposition rate at the sample.

In conclusion, it may be seen that the herein disclosed hollow cathode enhanced magnetron sputtering system with the unique particle collimating filter makes possible the production of semi-conductor devices far more rapidly and at significantly less expense.

Having thus described out invention, what we claim as new, and desire to secure by Letters Patent is:

1. In an etching/deposition system operable at low pressures for producing lift-off quality coatings comprising a hollow cathode electron source in combination with a magnetron sputter deposition plasma device within a containment chamber, said hollow cathode being disposed to inject electrons into the magnetic field of the magnetron plasma device adjacent to the magnetron cathode surface to which a deposition source is affixed, said system further including means for initiating and maintaining a discharge plasma within the hollow cathode and for initiating and maintaining the magnetron plasma, the improvement which comprises a workpiece to be coated located in said chamber, spaced from said magnetron cathode surface, a particle collimation filter assembly interposed between the magnetron cathode surface and said workpiece, but outside of said plasma region, which prevents any deposition particles from reaching said workpiece which are not travelling in a direction substantially normal thereto, and wherein said particle collimation filter assembly is composed of a plurality of closely packed elongated tubes, the axis of all of said tubes being disposed normal to both the magnetron cathode surface and the workpiece to be coated, each individual tube having a length-to-diameter ratio such that any particle attempting to travel through said tube is unable to do so if it is travelling in a direction more than ten degrees from the axis of said tube without striking said filter assembly.

2. An improved etching/deposition system as set forth in claim 1 wherein said particle collimation filter assembly is composed of a plurality of close-packed cylindrical tubes.

3. An improved etching/deposition system set forth in claim 1 wherein each of said tubes is rectangular in cross-section and is formed by a series of intersecting planar members forming a grid pattern of tubes.

4. An improved etching/deposition system as set forth in claim 1 wherein cooling means are provided for said particle collimation filter assembly for maintaining at least a portion of said assembly at a predetermined temperature.

5. An improved etching/deposition system as set forth in claim 1 including electrical biasing means connected between said particle collimation filter and said magnetron source for maintaining a desired potential gradient between the magnetron and the workpiece to be coated and for removing unwanted energetic electrons from the deposition zone.

6. An improved etching/deposition system as set forth in claim 1 including means for introducing a reactive gas into the containment chamber adjacent to the workpiece.

* * * * *